United States Patent [19]

Wehrs

[11] Patent Number: 4,598,251
[45] Date of Patent: Jul. 1, 1986

[54] FREQUENCY TO CURRENT CONVERTER CIRCUIT

[75] Inventor: David L. Wehrs, Woodbury, Minn.

[73] Assignee: Rosemount Inc., Eden Prairie, Minn.

[21] Appl. No.: 645,835

[22] Filed: Aug. 31, 1984

Related U.S. Application Data

[63] Continuation of Ser. No. 388,952, Jun. 16, 1982, abandoned.

[51] Int. Cl.[4] .......................... H03K 5/00; H03L 7/00
[52] U.S. Cl. .................................... 328/140; 307/519; 307/261; 307/265
[58] Field of Search ............... 307/234, 261, 350, 351, 307/352, 519, 297, 264, 265, 518; 328/141, 58, 140; 340/347 AD, 347 M; 324/78 R, 78 S

[56] References Cited

U.S. PATENT DOCUMENTS

| | | | |
|---|---|---|---|
| 2,824,285 | 2/1958 | Hunt | 328/127 |
| 3,047,820 | 7/1962 | Lawton | 328/127 |
| 3,428,829 | 2/1969 | Haynie et al. | 307/352 |
| 3,601,707 | 8/1971 | Bauer | 307/519 |
| 3,702,942 | 11/1972 | Aguirre | 307/352 |
| 3,714,463 | 1/1973 | Laune | 307/519 |
| 3,714,470 | 1/1973 | Goldberg | 307/265 |
| 3,723,891 | 3/1973 | Whiteley | 307/519 |
| 3,733,498 | 5/1973 | Watson | 307/297 |
| 3,754,880 | 10/1973 | Rose | 321/2 |
| 3,800,203 | 3/1974 | Pedersen et al. | 328/127 |
| 3,872,388 | 3/1975 | James | 307/519 |
| 3,991,323 | 11/1976 | Przybylski | 307/297 |
| 4,125,789 | 11/1978 | Van Schoiack | 307/297 |
| 4,228,366 | 10/1980 | Hüttemann et al. | 307/228 |
| 4,274,016 | 6/1981 | Ghahramani | 307/261 |
| 4,278,943 | 7/1981 | Masuda et al. | 307/240 |
| 4,284,956 | 8/1981 | Leffmann | 307/519 |
| 4,366,468 | 12/1982 | Yoneyama | 340/347 AD |

OTHER PUBLICATIONS

Public Use-Mag-X-Flowmeter sold by Fisher & Porter, Warminster, Pa.
Instruction Bulletin for Mag X Flow Converter 50 PZ 1000B, Rev. 1, pp. 8, 9, 28, 29 and 30, Fisher & Porter Company, Warminster, Pa., copyrighted 1980.

Primary Examiner—Stanley D. Miller
Assistant Examiner—Timothy P. Callahan
Attorney, Agent, or Firm—Kinney & Lange

[57] ABSTRACT

A circuit (10) receives a cyclic input signal having a frequency determined by a source (11), which frequency may vary in accordance with a parameter or condition to be measured, for example. The circuit (10) very precisely provides an output current representative of the frequency of the input signal. In particular, the circuit uses a pair of regulated and different voltage (16)(17), one (16) of which is impressed upon an averaging circuit (30) for a preselected time during each cycle of the input signal, and the other voltage (17) is impressed upon the averaging circuit (30) during the time when the first signal is not connected to the averaging circuit. A control signal ($V_o$) is developed from the averaging circuit (30) which is a function of the average of the voltage provided to the averaging circuit, and the control signal ($V_o$) in turn is used for controlling a current control amplifier (60) and transistors (61)(62) which in turn control current flow through a load (40) connected to output terminals (36)(37) and through a feedback resistor (63). The use of regulated voltage sources (16)(17) for deriving the current control signal insures great stability, relatively low cost, and precise operation.

20 Claims, 3 Drawing Figures

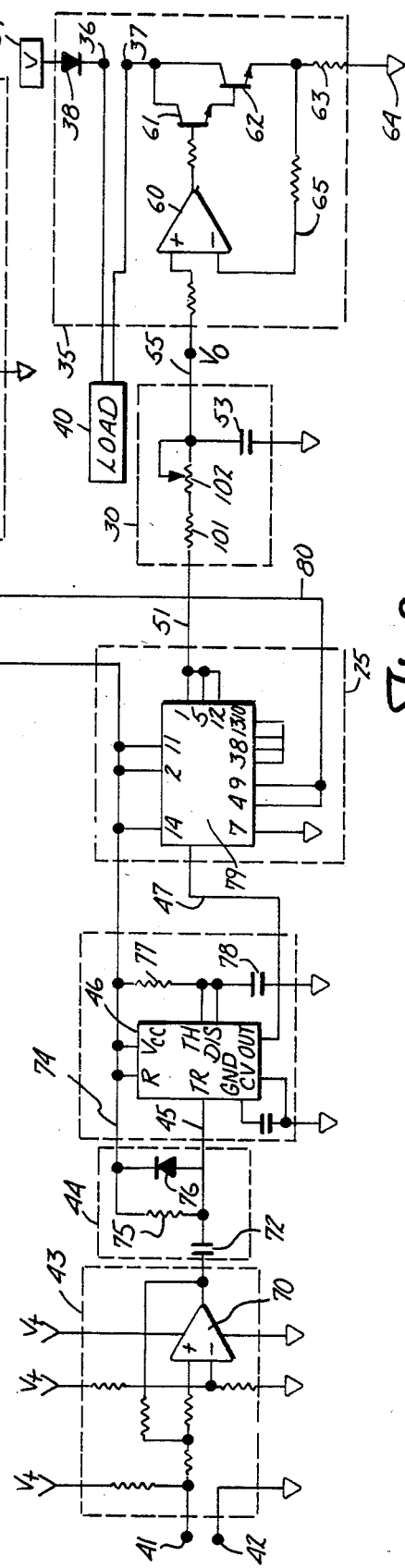
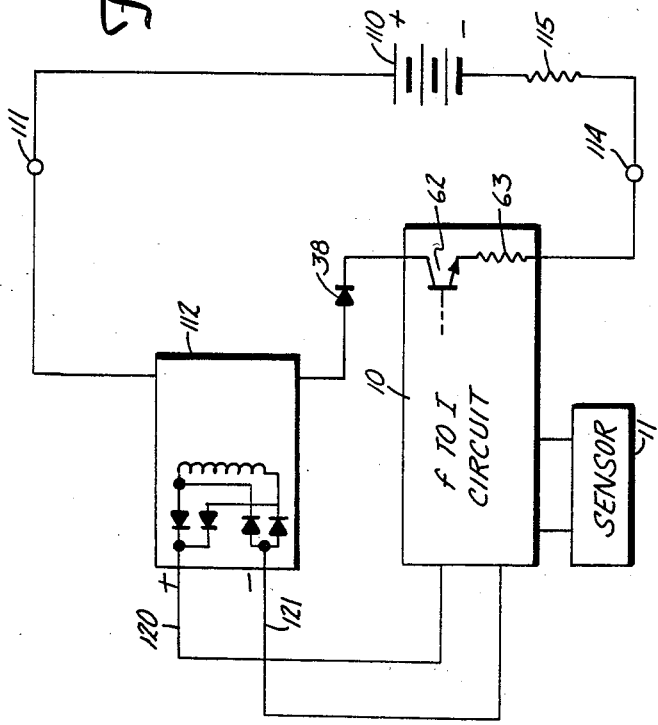

FREQUENCY TO CURRENT CONVERTER CIRCUIT

This application is a continuation of application Ser. No. 388,952, filed June 16, 1982, which is now abandoned.

BACKGROUND OF THE INVENTION

1. Field of the Invention.

The present invention relates to circuits for converting a cyclical frequency signal into a current signal proportional to the frequency of the cyclical signal.

2. Description of the Prior Art.

In the prior art there are frequency to current converter circuits that are used in connection with conversion of a "frequency" signal, for example, an output signal from a flowmeter or from a sensor that might sense a parameter, and which delivers a cyclical signal that has a frequency proportional to the value of the parameter. In many instances, switching circuits are utilized wherein each time the frequency signal crosses a threshold in a preselected direction (positive going or negative going), goes positive or exceeds a value, a high voltage signal derived from an independent source is connected to an averaging circuit, and after a set time a low voltage (generally circuit common) is switched to the averaging circuit and the average voltage value is used to control flow.

One major problem inherent in this type of conversion is getting a nonzero output current (for example 4 milliamps) for a zero value input signal (i.e. zero frequency). Usually some type of special zeroing circuit is needed in the output circuit to null against the positive output feedback signal that is present when the 4 milliamps current is flowing in the output current path.

The sources also are not well regulated in prior devices, and thus any control signal derived from the sources is not regulated to be precise and provide a precise output.

SUMMARY OF THE INVENTION

The present invention relates to a frequency to current converter circuit that provides a precise control signal derived from regulated sources to control an analog output in proportion to the frequency of a cyclic input signal. The circuit provides a switching function to connect a regulated high signal to an averaging circuit during a set time during each cycle of the input signal, with a regulated low signal being connected to the averaging circuit during the balance of the period of each cycle of the input signal. The regulated signals are preferably nonzero voltage signals. The control signal comprising a function of the average value of the two regulated voltage signals during each cycle is provided by the averaging circuit to an output circuit.

The control signal is used as a current control for regulating the current in an output current path. The currents, for example range from 4 milliamps at zero frequency of the input signal up to 20 milliamps with a 10 kilohertz input signal. The output current can be used for process control, or can be measured directly to determine the frequency of the input signal. When the input signal frequency is dependent upon a parameter, the current output is a function of such parameter.

The switching between two independently adjustable, regulated voltage sources as described, with the low voltage signal having a nonzero value provides a control signal that is a precise function of the frequency of the cyclic input signal, even when the frequency of the input is zero. The low voltage signal value is the value of the control signal at zero frequency, and a nonzero output current can be controlled precisely because there can be a nonzero control signal against which the feedback signal from the nonzero output current can be compared.

BRIEF DESCRIPTION OF THE DRAWINGS

FIG. 2 is an expanded schematic diagram of the circuit of FIG. 1 showing additional components; and FIG. 3 is a block diagram of the circuit of the present invention used as part of a two wire control system.

DETAILED DESCRIPTION OF THE PREFERRED EMBODIMENTS

Figure 1:
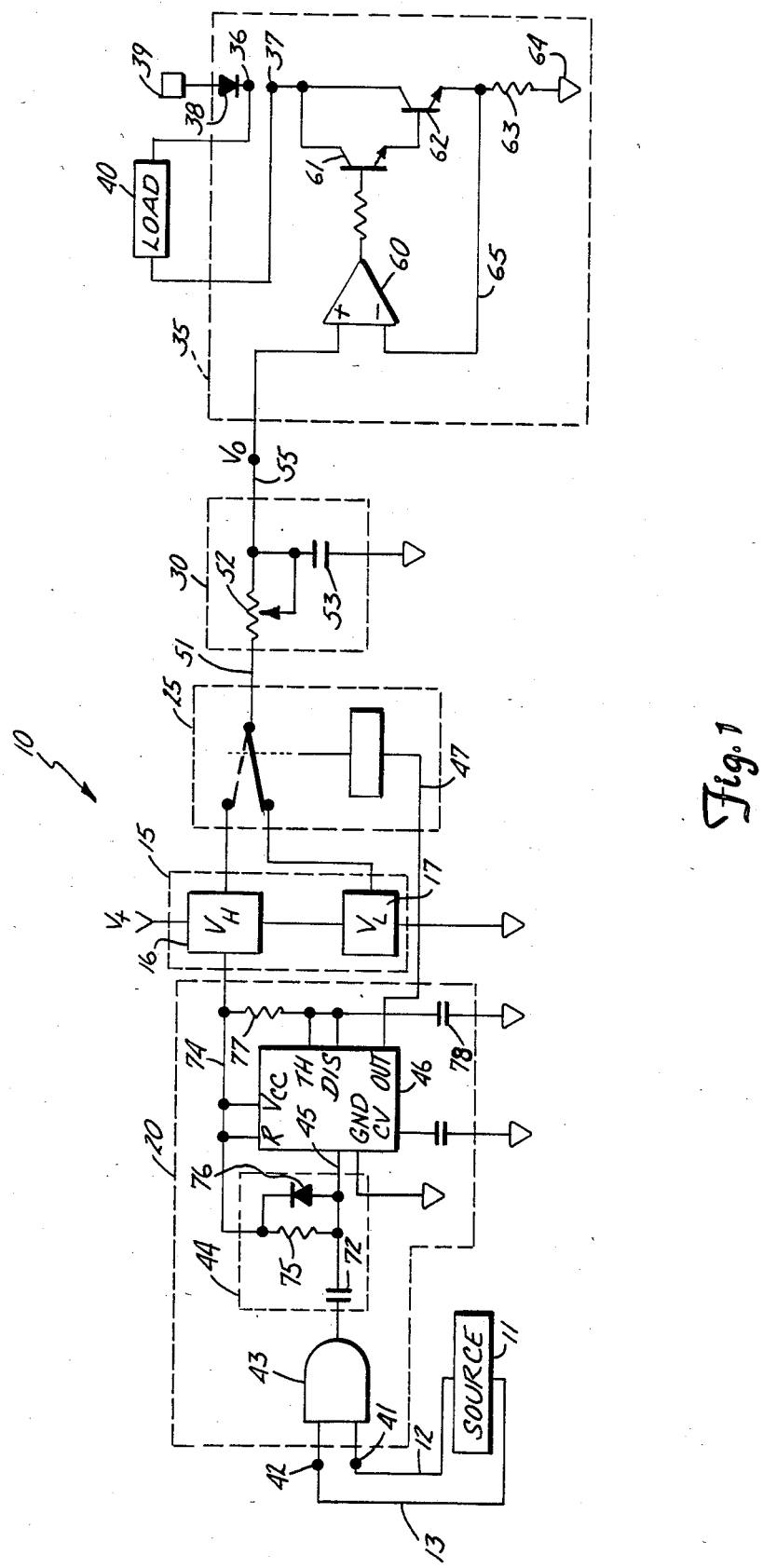
FIG. 1 is a simplified schematic-block diagram of a frequency to current converter circuit made according to the present invention.

In FIG. 1, the circuit made according to the present invention shown at 10 is adapted to convert a cyclic signal, sometimes called an input frequency signal, from a source indicated at 11 to an analog output current. Source 11 may be a sensor that provides a cyclic signal having a variable frequency proportional to the value of a parameter along lines 12 and 13. For example, many flowmeters and magnetic flowmeters may be configured with a sensor and signal conditioning electronics to provide such a signal such as shown in U.S. Pat. No. 4,309,909, and U.S. Pat. No. 4,311,053 shows a pressure sensor which provides such a signal. The input may be from some other source as well. The output current can be used for driving a load, or used in process control for operating controls for process equipment.

As an overview, the major components of the circuit 10 shown in FIG. 1 comprise voltage source means indicated generally at 15, which in turn comprises a source 16 of a first regulated signal such as a regulated high voltage and a source 17 of a second regulated signal such as a regulated low voltage. The cyclic input signal from lines 12 and 13 is passed through a frequency responsive switch control circuit 20 which provides a pulse control signal to a switch 25 and causes the switch 25 to connect the high voltage source 16 to a smoothing or averaging circuit 30 such as an R-C circuit, for a selected time during each cycle of the signal from the source 11. The control pulses from control circuit 20 to switch 25 thus are at the same frequency as the input signal. The known time period during which the regulated high voltage source 16 is connected by switch 25 to averaging circuit 30 is commenced at a selected known threshold value of each cycle of the signal from source 11.

For the remainder of the time during each cycle of the cyclic signal from source 11, the switch 25 connects the regulated low voltage source 17 to the soothing or averaging circuit 30. The output from the averaging circuit 30, which is a function of the time average of the regulated voltage signals provided through switch 25, comprises a control signal $V_o$, that is provided to an output stage circuit 35. The control signal $V_o$ in turn controls the level of current in a current path from a single ended voltage source 39 through a load 40 connected in series with output terminals 36 and 37. Because the voltage of the control signal from averaging circuit 30 is a function of the frequency of operation of switch 25 and thus the frequency of the input signal from source 11, the current is controlled as a function of the frequency of the input signal.

In greater detail, the switch control circuit 20 has input terminals 41 and 42 connected to lines 12 and 13. A Schmitt trigger circuit 43 is coupled to terminals 41 and 42. The Schmitt trigger 43 provides a generally square leading edge to each triggering pulse of the cyclic input signal along lines 12 and 13. It is therefore apparent that the cyclic input signal has to have signal levels that are of a magnitude which can be detected by the Schmitt trigger 43.

The output of Schmitt trigger 43, at the start of each cycle of the input frequency signal, acts through a signal level translation circuit 44 along line 45 to trigger a No. 555 TTL timer circuit 46 operating as a precision monostable multivibrator or "one shot". The "one shot" 46 is connected as a timer that provides a fifty microsecond long pulse along its output line 47 to switch 25.

Switch 25 as shown is a number 14007 CMOS Dual Complimentary Pair-Plus Inverter, wired to be driven as an analog single pole, double throw switch. The switch 25 is shown only schematically, and as stated each time the one shot 46 is triggered (once each cycle of the input signal) the fifty microsecond long pulse on line 47 causes the switch 25 to connect the regulated high voltage signal from source 16 to an output line 51 of the switch 25 for that fifty microsecond time period.

The output line 51 of the switch 25 is connected to the smoothing or averaging circuit 30 which includes an adjustable resistor 52 (to permit adjusting the time constant) and a capacitor 53 selected to have a desired time constant suitable for operation at the selected frequencies of the input signal. A minimum time constant of one second (95% step response) is required. While the one shot 46 provides an output signal that is precisely the same frequency as the cyclic input signal from source 11 along lines 12 and 13, the pulse width along line 47 is, as disclosed, only fifty microseconds long. During the rest of the time period of each cycle of the input signal from source 11 the regulated, low voltage source 17 having a value which is not zero or circuit common, is connected by switch 25 to the smoothing or averaging circuit 30. The control signal $V_o$ is provided along a line 55 which is at a voltage level that is a function of the average of the voltages received by the averaging circuit 30 during its time constant.

In the present application, the frequency to current converter circuit 10 is designed specifically to operate with input signal frequencies of from zero to 10 kilohertz. The fifty microsecond pulse along line 47 causes switch 25 to connect the regulated high voltage source 16 to the smoothing or averaging circuit 30 fifty percent of the time when the input signal has a frequency of 10 kilohertz.

The control signal $V_o$ on line 55 is provided to the output stage circuit 35 as stated, and in particular to the noninverting input of an operational amplifier 60 forming part of the output stage. The output current path from source 39 through load 40 includes a signal diode 38, and also includes a Darlington pair of current control transistors 61 and 62. Transistor 62 regulates or controls current through load 40 and has its collector connected to terminal 37 and its emitter connected through a feedback resistor 63 to circuit common 64.

Amplifier 60 has its output connected to the base of transistor 61 which forms the first stage of the current control. The emitter of transistor 61 is coupled to the base of the final current regulating or control transistor 62. Source 39 can be any desired source of DC voltage for providing the necessary voltage for obtaining the current desired. As shown, a 36 volt source has been found satisfactory.

The feedback signal from resistor 63 is provided by a feedback line 65 to the inverting input of amplifier 60. Amplifier 60 is effectively a current control amplifier responsive to the control signal along line 55. By selecting the value of feedback resistor 63 properly, the range of control of the transistor 62 and thus the output current will be proper for operation across the frequencies to be sensed. As stated, in many process control operations a current range between 4 and 20 milliamps is provided. For a range of 4 to 20 milliamps output current through the current path, it has been found that the regulated voltage from the high voltage source 16 in the range of 9 volts, with the regulated voltage on the low voltage source 17 approximately one volt, at 10 kilohertz the control signal on line 55 will be five volts, and at zero kilohertz the control signal will be one volt. With a feedback resistor of 250 ohms, these voltage levels provide an output current of 4 to 20 milliamps across the desired range of frequencies to be sensed.

In prior devices, zeroing the circuit for converting frequency to current was quite difficult, because the low voltage being switched was a circuit common or zero level and the low end of the output current range is positive, so that a positive feedback voltage is developed at zero frequency input signal. Thus, some type of a separate zeroing circuit is usually needed in the output stage in the prior art devices. The present circuit rids the designer of that problem. When the zero input signal is at zero frequency, there can be a nonzero control voltage provided from source 16 for offsetting the positive feedback voltage at the minimum output current value.

Certain circuit components are shown in greater detail in FIG. 2, and it can be seen that the Schmitt trigger 43 includes an operational amplifier 70. The input terminal 42 is connected to circuit common as shown, and input terminal 41 is connected through resistors to the noninverting input terminal of the operational amplifier 70. The inverting terminal of amplifier 70 is connected to a voltage divider from a source "V+" which is, in the form shown 12 volts. The level at the inverting terminal is thus approximately six volts in the form shown. The output from the operational amplifier 70 and the Schmitt trigger 43 is fed to the line 45 through a capacitor 72. The presence of a negative going signal at terminal 41 causes the output of operational amplifier 70 to decrease, in turn causing the voltage along the line 45 to be reduced below the threshold or triggering level of one shot 46 and causing the output signal on line 47 to be a positive pulse for the fifty microsecond duration.

Energization of the one shot or precision monostable multivibrator 46 is provided by line 74 leading from the regulated high voltage source 16, which is regulated at approximately nine volts as disclosed. The use of a resistor 75 and diode 76 connected in parallel between the line 74 carrying the high regulated voltage and line 45 insures that the one shot 46 is triggered properly as the Schmitt trigger 43 output goes low. The 555 one shot 46 is powered from the line 74 carrying the high regulated voltage because the output pulse width (the fifty microsecond pulse) is sensitive to variations in supply voltage. The high regulated voltage source 16 provides a stable supply.

The time period of the one shot 46 is determined by an RC network comprising a resistor 77 and capacitor 78 connected in series across line 74 and circuit common. The resistor 77 and capacitor 78 are connected to the proper pins of the 555 forming the one shot 46. The pulse width (or time) is defined by:

$$pw = (1.1)(R_{77})(C_{78}).$$

The switch 25 includes the 14007 CMOS Dual Complimentary Pair-Pulse Converter 79 whose terminals are connected so it operates as a single pole, double throw switch operable to connect the line 74 carrying the high regulated voltage from source 16 to output line 51 for the fifty microsecond pulse duration during each cycle of the input signal, and to connect a line 80 carrying the regulated low voltage from source 17 (which is connected to the CMOS pulse converter 79) to line 51 for the balance of the cycle time period of each cycle of the input signal. The switch 25 is also powered from the regulated high voltage source 16.

The regulated voltage sources 16 and 17 are part of the voltage source means 15. As shown in FIG. 2, a voltage source (V+) which is an unregulated supply at approximately 12 volts, is connected through a transistor 81 to a line 82 connected in turn to line 74. A voltage reference means such as a Zener diode 83 is connected in series with a resistor 84 between line 82 and a circuit common line 85. A voltage divider comprising a resistor 86, a potentiometer 87 and a resistor 88 are also connected between line 82 and the circuit common line 85. The wiper of the potentiometer 87 is connected to a line 90 that is connected to the inverting input of an operational amplifier 91, and the noninverting input of amplifier 91 is connected through a line 93 to a junction 94 which is at a reference voltage level established by Zener diode 83. Junction 94 is coupled through a resistor 95 to a potentiometer 96 which is connected in series to a resistor 97, which is also connected to the circuit common line 85. The wiper 98 of the potentiometer 96 is coupled to the low regulated voltage line 80.

The output of operational amplifier 91 is connected through a line 99 and a resistor to the base of transistor 81 which is also coupled through a resistor to the voltage source V+. Thus it can be seen that the voltage at junction 94 is maintained at the set voltage controlled by the Zener diode 83, and the low regulated voltage on wiper 98 and line 80 is adjusted merely by moving the potentiometer until the voltage level on line 80 is at the desired value. The resistors 95, 97 and potentiometer 96 are selected to provide the proper voltage range. Thus the low regulated voltage is regulated independently and adjusted independently of the high regulated voltage.

The Zener diode 83 provides a very stable regulated voltage at junction 94 which is temperature stable depending on the characteristics of the diode.

In order to regulate the voltage on line 82, and thus the high regulated voltage provided on line 74, the potentiometer 87 can be adjusted to change the value of the voltage at the inverting input terminal of operational amplifier 91. Because the noninverting input terminal of amplifier 91 is maintained at the reference voltage set by the Zener diode 83, the change in voltage on line 90 will cause a change in voltage on line 99, thereby resulting in a change in current being passed by transistor 81. If the current increases it will be dumped through resistor 84 and the Zener diode 83, and this will cause the voltage on line 82 to be raised due to a change in the voltage drop across the resistor 84. Balance will be restored at the inputs of amplifier 91 and the voltage on line 82 will thus be regulated at a new level determined by potentiometer 87. In particular, the amplifier 91 shields the regulated high and low voltages from each other such that the first and second adjusting means, comprising potentiometer 96 and potentiometer 87, adjust the magnitudes of the regulated low and high voltages, respectively without affecting the magnitudes of each other. The change in current flow that changes the high voltage does not affect substantially the Zener diode voltage for normal current flows through transistor 81, thus the low and high regulated voltages are independently adjustable.

The regulation of the high regulated voltage independent of the value of the low regulated voltage, despite changes in supply voltage V+ is generally as follows. If V+ increases, it causes an initial increase in voltage at line 82, which in turn raises the voltage at line 90 with respect to the reference voltage at line 93. This causes the output on line 99 of amplifier 91 to drop, thus reducing current flow through transistor 81 and reducing voltage at line 82 to its regulated value. Balance is restored at the inputs to amplifier 91, and the high voltage at line 82 is regulated. Similar regulation occurs when V+ decreases.

The adjustable resistor shown generally at 52 in FIG. 1 of smoothing or averaging circuit 30 may specifically include a fixed resistor 101 in series with a potentiometer 102 as shown in FIG. 2. The potentiometer permits adjusting the time constant of the smoothing or averaging circuit with capacitor 53 at one microfarad and resistor 101 at 300 K ohm, a 5 meg ohm single turn potentiometer as potentiometer 102 provided time constant adjustments of from 1 to 15 seconds. The components are chosen to also minimize ripples in $V_o$. Longer time constants can be attained by using larger resistors or in other conventional ways. Also, amplifier 60 is chosen to have high input resistance and low input current requirements.

Because some nonlinearity error may be introduced by discharge currents of averaging circuit 30 and to a lesser degree by charge currents, the current through the networks of voltage source means 15 is kept quite high, for example 5 milliamps. The circuits for regulated sources 16 and 17 are quite temperature stable and simple to build.

In FIG. 3 a typical arrangement for use of the circuitry 10 in combination with a two wire process control system is shown only in block diagrams for simplicity. In this instance, the circuit 10 which converts freqency to current is connected into a two wire process control circuitry wherein two wires carry a signal such as a DC current $I_r$ which has a magnitude representative of the parameter to be measured as well as power for the sensing apparatus.

In this case the circuit 10 represented by a block is sensitive to a sensor or flowmeter as source 11, which provides a cyclic signal that has a frequency which is dependent on a variable parameter and which will be sensed and made proportional to an analog output current. The two wire system of the present invention includes a power source 110 having a line connected in series through a current input terminal 111 to an isolated power supply 112. The power supply 112 is preferably a DC to DC converter and can be of any desired form which will provide a voltage drop to thereby establish a voltage corresponding substantially to the voltage of source 39, and will have an isolated output that will provide voltages at a selected level for powering components of the circuit 10. For example, the isolated power supply 112 establishes a voltage for the signal diode 38 which is connected to the collector of transistor 62 in circuit 10. The output terminals 36 and 37 are coupled together and not utilized. The emitter of transistor 62 is connected through the feedback resistor 63, but the other end of the feedback resistor is connected through a line to a terminal 114 comprising a current return terminal that is connected to a load resistor 115 which in turn is connected in series with the power supply 110. Load resistor 115 may comprise an actuator, a controller, a recorder or simply a current indicating instrument.

It can be seen that the feedback resistor 63 is connected to the terminal 114 to complete a two wire circuit having terminals 111 and 114 through which a power source and load in series can be coupled for powering the circuit and for receiving the 4–20 milliamp (or other current) signal. The feedback signal from resistor 63 controls the current flow as previously described.

The isolated power supply 112 is made to have an isolated voltage output along a line 120 which is the proper voltage level (for example 12 volts) for use as the V+ source in the form shown in FIGS. 1 and 2. A line 121 which comprises the return of the isolated output of the isolated power supply 112 is connected to the circuit common connections shown in FIGS. 1 and 2 of the present application.

The schematic showing of FIG. 3 shows that an isolated power supply 112 and circuit 10 can be operated through the two wires connected to terminals 111 and 114 to establish the 36 volt supply 39 as well as the V+ supply for the components. The power supply 112 also can be bused for powering the sensor comprising sensor 11. The operation of the circuit 10 will be exactly the same as described, except that the output current will pass through the feedback resistor 63, and through the return terminal 114 to the load 115 and then returned to the power supply 110.

The connections of power supply 112 and circuit 10 can also be made so that they are similar to that shown in U.S. Pat. No. 3,764,880 which shows a DC to DC converter. The output lines 120 and 121 of the present application correspond generally to lines 56 and 57 of U.S. Pat. No. 3,764,880.

What is claimed is:

1. A circuit for converting a variable frequency cyclic input signal to a current output signal having a magnitude representative of the frequency of the input signal, the magnitude being a non-zero value for a frequency of zero Hertz, comprising:
    regulated supply means for providing a first non-zero regulated electrical signal and a second non-zero regulated electrical signal, the first and second regulated signals having different magnitudes;
    switching means having a switching means output responsive to the input signal and coupled to the regulated supply means for alternately providing the first regulated signal and the second regulated signal at the switching means output for lengths of time which vary relative to one another depending upon the frequency of the input signal;
    averaging means coupled to the switching means output to receive the first and second regulated signals for providing an average signal from the regulated signals; and
    output means for providing a current output signal having a magnitude controlled by the average signal.

2. The circuit of claim 1 wherein the regulated supply means comprises a voltage reference means for providing one of the regulated electrical signals.

3. The circuit of claim 2 wherein the regulated supply means further comprises an amplifier means for providing the first or the second regulated signal not provided for by the voltage reference means.

4. The circuit of claim 1 wherein the switching means provides one of the regulated signals for a predetermined length of time responsive to a predetermined transition of the cyclic input signal which occurs once each cycle and provides the other regulated signal for a remainder of such cycle.

5. Means to provide an analog output current which has a magnitude controlled by the frequency of a cyclical input signal having a variable cycle time period so that the magnitude is a non-zero value when the frequency is zero Hertz, the means comprising:
    first means for providing a first non-zero regulated electrical signal;
    second means for providing a second non-zero regulated electrical signal different from the first regulated signal;
    third means for providing the first signal for a predetermined length of time less than the cycle time period of the input signal at an upper frequency limit once during each cycle of the input signal;
    fourth means for providing the second regulated signal for a remainder of the cycle time period during each cycle of the input signal; and
    output means for receiving the first and second regulated signals from the third and fourth means including means for providing a control signal having a value which is a function of an average magnitude of the first and second regulated signals received by the output means during a reference time period and including means responsive to the control signal for providing the output current having a magnitude controlled by the control signal.

6. The means to provide an analog output current of claim 5 wherein said means responsive to the control signal includes an amplifier, and current control means adapted to be coupled in series with a signal source and load, said control signal and a feedback signal being connected to control an output of said amplifier, the output of said amplifier controlling the output current through said current control means, and a feedback resistor sensitive to the current flowing through said current control means and providing the feedback signal to maintain the output current at a level which is a function of the control signal.

7. The means to provide an analog output current of claim 8 wherein the first and second regulated signals are both nonzero voltage signals and the analog output signal is a current having a positive value when the frequency of the input signal is zero.

8. A signal frequency to current converter for providing an output current signal having a magnitude which is controlled by a frequency of a cyclical input signal having a cycle time period and which has a positive non-zero threshold value when the frequency of the input signal is zero, said converter comprising:

first means for providing a first non-zero voltage signal;

second means providing a second non-zero voltage signal different from the first voltage signal;

third means for providing a control signal;

means for coupling the first means to the third means for a predetermined length of time which is less than the cycle time period once during each cycle of the input signal;

means for coupling the second means to the third means for a portion of the cycle time period when the first means is not so coupled during each cycle of the input signal;

said third means providing a control signal with a value which is a function of an average voltage provided to the third means by the first and second means during each cycle time period; and an output circuit coupled to the third means and including means responsive to the control signal to provide an output current having a magnitude controlled by the value of the control signal.

9. The signal frequency to current converter of claim 8 wherein said output circuit includes an amplifier, and means establishing an output current path including terminals connectable to a load through which the output current will pass, said third means being connected so the control signal and a feedback signal control an output of said amplifier, the output of said amplifier controlling the output current through said current path, and a feedback resistor sensitive to the output current through said current path providing the feedback signal to the amplifier to control the output of the amplifier at a level which provides the output current through the current path which is substantially a linear function of the control signal.

10. The signal frequency to current converter of claim 8 wherein said means for coupling includes switch means and switch control means, said switch control means operating said switch means to connect the first voltage signal to the output for said predetermined time period, said switch control means including means triggered once during each cycle of said input signal to operate the switch means to couple the first means to the third means for the predetermined time only.

11. The signal frequency to current converter of claim 8 wherein said third means comprises a resistance-capacitance circuit having a preselected time constant.

12. The signal frequency to current converter of claim 8 wherein said first means and second means comprise sources of voltage including means comprising active circuit means to regulate a magnitude of each voltage signal at a nonzero value.

13. The signal frequency to current converter of claim 12 wherein the first means provides the first voltage signal with a higher magnitude than the magnitude of the second voltage signal from the second means.

14. The signal frequency to current converter of claim 12 wherein said first means and second means comprise regulated voltage supply means, said regulated voltage supply means including voltage reference means comprising the second means, said first means including a resistor and a current control amplifier controlling a current through said resistor, and said first means being coupled to provide the first voltage signal as a voltage which is a function of the current through the resistor.

15. The signal frequency to current converter of claim 14 wherein the second means further comprises a potentiometer coupled to receive a reference voltage signal from the voltage reference means and being adjustable to permit adjusting the magnitude of the second voltage signal.

16. The signal frequency to current converter of claim 15 wherein said amplifier is a differential input amplifier having a first input coupled to receive the reference voltage signal to provide a reference input, a second input of the amplifier being coupled to be sensitive to a control voltage dependent upon the current controlled by the amplifier, and means to permit adjustment of the control voltage provided when a preselected current is controlled by the amplifier.

17. The signal frequency to current converter of claim 8 wherein said output circuit includes a pair of terminals connectable to a series connected source and load, a power supply connected to one terminal and providing power for the first, second and third means, means in the output circuit for providing a current path from the power supply to the second terminal, the means responsive including means in the current path for controlling the output current through the terminals.

18. A frequency-to-current converter circuit for providing an output current with a magnitude which has a predetermined relationship to a frequency of a cyclic input signal, the circuit comprising:

means for providing a non-zero regulated first voltage;

means for providing a non-zero regulated second voltage;

means for alternately supplying the first and second voltages for first and second time periods, respectively, during each cycle, the first and second time periods having relative durations which are a function of the frequency of the input signal;

means for averaging the first and second voltages supplied during the first and second time periods to produce an average voltage;

means for providing a feedback voltage which is a function of the magnitude of the output current; and means for controlling the magnitude of the output current as a function of the average voltage and the feedback voltage so that the output current maintains the predetermined relationship to the frequency of the input signal.

19. A circuit for converting a cyclic input signal to an analog output signal having a magnitude representative of frequency of the input signal, the magnitude being a non-zero value when the frequency is zero Hertz, the circuit comprising:

regulated supply means for providing a first regulated electrical signal and a second regulated electrical signal, the first and second regulated signals having different non-zero magnitudes, wherein the regulated supply means comprises first and second adjusting means coupled to permit adjusting the magnitudes of the first and second regulated electrical signals;

switching means having a switching means output responsive to the input signal and coupled to the regulated supply means for alternately providing the first regulated signal and the second regulated signal at the switching means output;

averaging means coupled to the switching means output to receive the first and second regulated signals for providing an average signal from the regulated signals; and output means for providing a current output signal having a magnitude controlled by the average signal.

20. The circuit of claim 19 wherein the first and second adjusting means are arranged such that the magnitude of either regulated signal can be adjusted without affecting the magnitude of the other regulated signal.

* * * * *